(12) United States Patent
Moriya

(10) Patent No.: US 7,449,820 B2
(45) Date of Patent: Nov. 11, 2008

(54) SURFACE MOUNT TYPE CRYSTAL DEVICE

(75) Inventor: Kouichi Moriya, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 124 days.

(21) Appl. No.: 11/699,547

(22) Filed: Jan. 30, 2007

(65) Prior Publication Data

US 2007/0176518 A1 Aug. 2, 2007

(30) Foreign Application Priority Data

Jan. 31, 2006 (JP) ............................. 2006-023939

(51) Int. Cl.
H01L 41/053 (2006.01)
H03B 1/00 (2006.01)

(52) U.S. Cl. ...................... 310/348; 310/340; 310/365; 331/68; 331/108

(58) Field of Classification Search ................. 310/340, 310/348, 365; 331/68, 108
See application file for complete search history.

(56) References Cited

U.S. PATENT DOCUMENTS 5,423,207 A * 6/1995 Flechsig et al. ............... 73/104
6,507,139 B1 * 1/2003 Ishino et al. ................. 310/348
6,628,179 B2 * 9/2003 Yatsuda et al. .............. 333/193
6,998,925 B2 * 2/2006 Harima et al. ................ 331/68
2002/0036448 A1 * 3/2002 Kageyama et al. .......... 310/348
2002/0084858 A1 * 7/2002 Luff ............................ 331/68
2003/0197569 A1 * 10/2003 Mizusawa .................... 331/158
2005/0184625 A1 * 8/2005 Miyazaki ..................... 310/348

* cited by examiner

*Primary Examiner*—Thomas M Dougherty
(74) *Attorney, Agent, or Firm*—Fitch, Even, Tabin & Flannery

(57) ABSTRACT

A crystal device for surface mounting is provided with at least: a container body having a substantially rectangular outer shape and mounting electrodes formed in the four corners of the outside bottom surface of the container body; and a crystal blank hermetically sealed within the container body. The spacing of mounting electrodes on at least one side of the outside bottom surface is less than the length of the mounting electrodes in the direction along that side. A jetty having a height greater than the thickness of the mounting electrodes is provided in the cross-shaped area interposed between the mounting electrodes on the outside bottom surface.

7 Claims, 4 Drawing Sheets

SURFACE MOUNT TYPE CRYSTAL DEVICE

This Application is a U.S. Utility Patent Application which claims foreign priority from Japanese Application No. 2006-023939, filed Jan. 31, 2006, the complete disclosure of which is incorporated herein by reference.

BACKGROUND OF THE INVENTION

1. Field of the Invention

The present invention takes relates to a surface mount type crystal device such as a crystal unit or crystal oscillator, and more particularly, relates to a compact crystal device that can prevent the occurrence of short-circuiting between package electrodes when the device is mounted on a wiring board.

2. Description of the Related Arts

Crystal devices are electronic components that use the piezoelectric properties of quartz crystals, and such crystal devices find use in various electronic devices. Representative examples of crystal devices include a crystal unit in which a crystal blank is hermetically encapsulated in a case, and a crystal oscillator in which a crystal element and an oscillation circuit that uses this crystal element are integrated as a single unit. With the advances in the miniaturization of electronic components in recent years, smaller sizes are also being sought for crystal devices, and various types of surface mount type crystal devices are being developed.

FIGS. 1A and 1B are a sectional view and bottom plan view showing the configuration of a surface mount type crystal unit of the prior art as an example of a surface mount type crystal device.

A surface mount type crystal unit is a device in which crystal blank 2 is accommodated within container body 1 for surface mounting and then covered by metal cover 3 to hermetically seal crystal blank 2. Container body 1 is composed of, for example, laminated ceramics and has an approximately rectangular planar outer shape, i.e., an approximately flat rectangular parallelepiped outer shape that appears rectangular when mounted on a wiring board and viewed from above. A cavity is formed in the upper surface of container body 1 for accommodating crystal blank 2. A pair of crystal holding terminals 4 are provided on the inner bottom surface of the cavity, each terminal 4 being close to a position on a respective end of one side of the inner bottom surface of the cavity. As will be explained hereinbelow, crystal holding terminals 4 are used for both electrically and mechanically holding crystal blank 2 in the cavity. In addition, mounting electrodes used when mounting container body 1 on a wiring board are provided at the four corners of the outside bottom surface of container body 1, i.e., on the surface of container body 1 that faces a wiring board when mounted on the wiring board. Each mounting electrode is formed as an approximately rectangular conductive layer. Of these four mounting electrodes, one pair of mounting electrodes 5a positioned at the two ends of one diagonal line on the outer bottom surface of container body 1 are electrically connected to the pair of crystal holding terminals 4 by way of conductive paths that are formed on the laminated plane of the laminated ceramics and the end surface of container body 1. The remaining two mounting electrodes 5b are used as grounding terminals.

As shown in FIG. 2, crystal blank 2 is composed of, for example, an AT-cut quartz crystal blank of approximately rectangular shape, excitation electrodes 6a being formed on each of the two principal surfaces. Extension electrodes 6b extend from the pair of excitation electrodes 6a toward the two sides of one end of crystal blank 2. Crystal blank 2 is secured and held within the cavity of container body 1 by securing these extension electrodes 6b to respective crystal holding terminals 4 by means of, for example, a conductive adhesive 7 at the positions at which the pair of extension electrodes 6b are led out, and crystal blank 2 is thus electrically and mechanically connected to container body 1.

A thick metal film or metal ring 8 is provided on the upper surface of container body 1 to surround the cavity, and metal cover 3 is bonded to metal ring 8 by seam welding or beam welding. Metal ring 8 is electrically connected to mounting electrodes 5b that are used as grounding electrodes by way of through-holes formed in container body 1.

As shown in FIG. 3, this type of crystal unit is typically mounted on wiring board 9 by reflow soldering. Reflow soldering is carried out by applying cream solder 10 to circuit terminals 11 provided on the surface of wiring board 9, then positioning mounting electrodes 5 of the crystal unit with respect to circuit terminals 11, and then conveying these components into a high-temperature furnace to melt cream solder 10. As a result, circuit terminals 11 and mounting electrodes 5 are electrically and mechanically bonded to each other, and the crystal unit is mounted on wiring board 9.

However, with the progress of miniaturization of the surface mount type crystal unit according to the above-described configuration, the spacing between the mounting electrodes decreases, giving rise to the occurrence of electrical short circuits between the mounting electrodes after reflow soldering. FIG. 4 shows the bottom surface of a miniaturized crystal unit. When the planar outer shape of container body 1 is, for example, 2.0 (length L) mm×1.6 (width W) mm, each mounting electrode has a length "a" of 0.7 mm and a width "b" of 0.5 mm. In this case, the spacing "c" between mounting electrodes at each side of container body 1 is 0.6 mm. This spacing "c" is smaller than the length "a" of the mounting electrodes.

Flux is typically mixed with cream solder 10 that is applied to circuit terminals 11 of wiring board 9 to facilitate the flow of melted solder. When cream solder 10 is melted, the flux protrudes from the outer peripheries of circuit terminals 11 and mounting electrodes 5, and the melted solder itself also flows from circuit terminals 11 and mounting electrodes 5 along with the flux. As the spacing "c" between mounting electrodes 5 decreases, the potential increases for connection between neighboring circuit terminals 11 and between neighboring mounting electrodes 5 and the consequent occurrence of electrical short circuits.

If the flux does not flow out, the melted solder itself will not flow onto wiring board 9 composed of an insulating material such as a ceramic material or a glass fiber reinforcement epoxy resin material.

Electrical short circuits between mounting electrodes resulting from this solder can occur not only in surface mount type crystal units, but with the miniaturization of crystal devices, can also occur in surface mount type crystal devices.

SUMMARY OF THE INVENTION

It is an object of the present invention to provide a crystal device for surface mounting in which electrical short circuits caused by solder between mounting electrodes are prevented.

The object of the present invention is achieved by a crystal device for surface mounting that is provided with at least: a container body having a substantially rectangular outer shape in which mounting electrodes are formed in the four corners of the outside bottom surface; and a crystal blank that is hermetically sealed within the receptacle; wherein the spacing between mounting electrodes on at least one side of the outside bottom surface is smaller than the length of the mounting electrodes in the direction along that side; and a jetty having a height that is greater than the thickness of the mounting electrodes is provided in a cross-shaped area interposed between the mounting electrodes on the outside bottom surface.

With this configuration, the flow of flux from the melted solder during reflow soldering is checked by the jetty, whereby the flow of solder that accompanies the flux is also prevented. As a result, electrical short circuits can be prevented between the mounting electrodes of the crystal device and between adjacent circuit terminals on a wiring board on which the crystal device is mounted.

The container body is composed of, for example, laminated ceramics. When the container body is composed of laminated ceramics, the jetty can be provided at low cost and without increasing the number of laminations of ceramic green sheets or ceramic raw sheets (unburned ceramic sheets) by simply applying a ceramic paste to the ceramic green sheet that corresponds to the outside bottom surface before burning and then burning the laminated ceramic green sheet with the applied ceramic paste to form the container body.

DETAILED DESCRIPTION OF THE PREFERRED EMBODIMENT

Figure 5A:
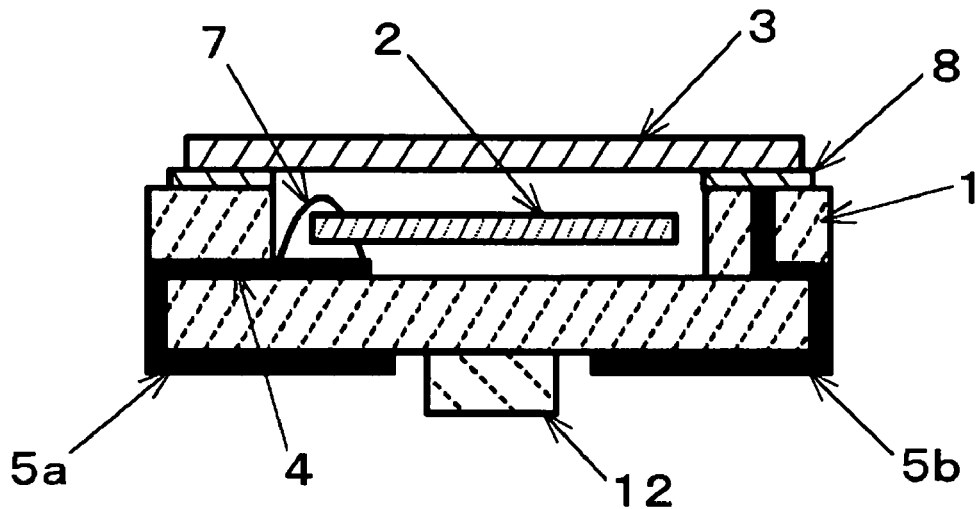
FIGS. 5A and 5B are a sectional view and a bottom plan view, respectively, showing the configuration of a surface mount type crystal unit according to an embodiment of the present invention.
Figure 5B:
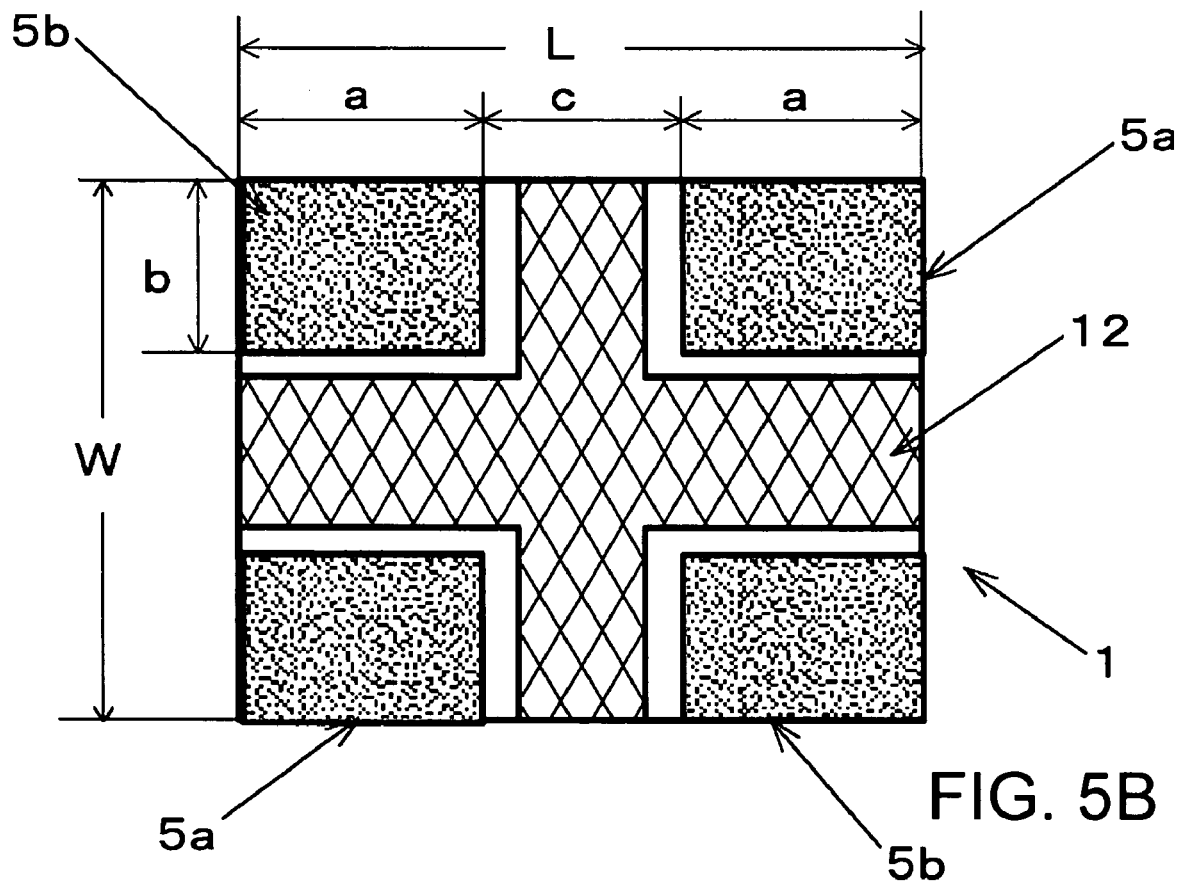

FIGS. 5A and 5B show a surface mount type crystal unit, which is one example of a surface mount type crystal device based on the present invention. In FIGS. 5A and 5B, the same reference numerals are applied to constituent elements identical to those in the above-described FIGS. 1A and 1B, and redundant explanation is not repeated.

Figure 1A:
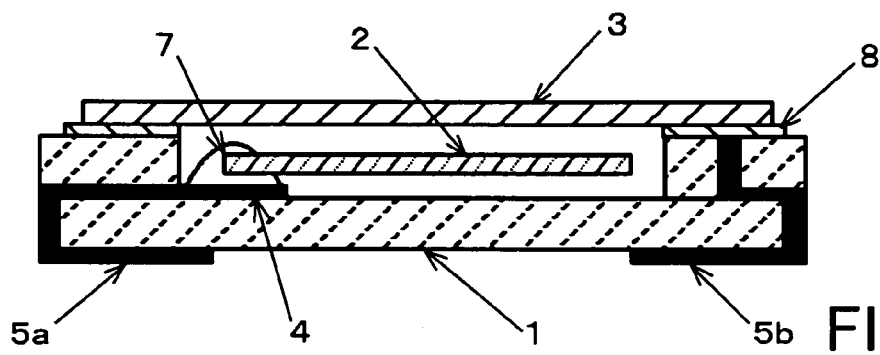
FIGS. 1A and 1B are a sectional view and a bottom plan view, respectively, showing the configuration of a surface mount type crystal unit of the prior art.
Figure 1B:
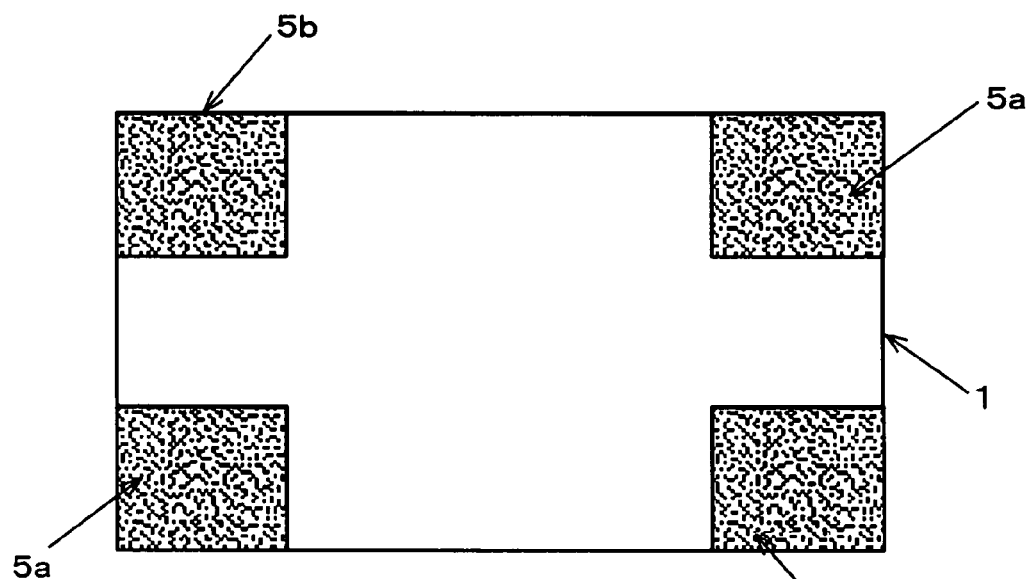
Figure 2:
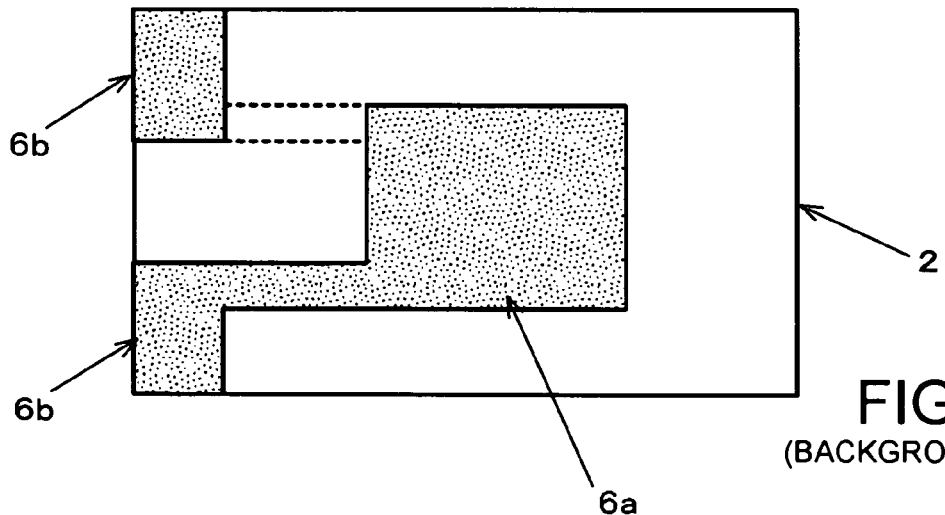
FIG. 2 is a plan view showing a crystal blank.
Figure 3:
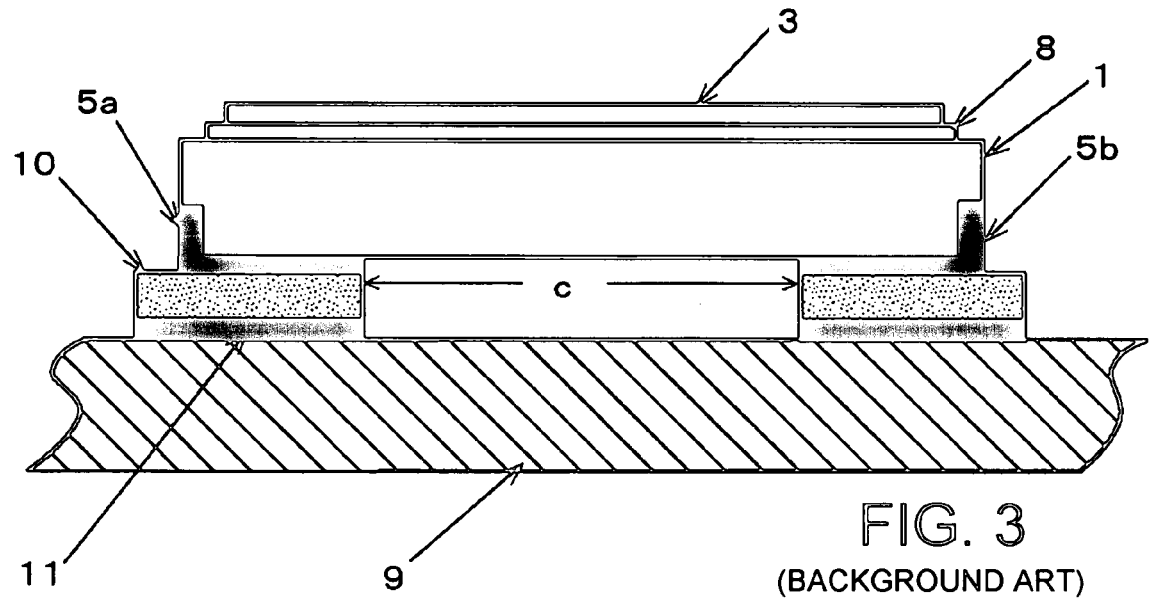
FIG. 3 is a sectional view showing the surface mount type crystal unit when mounted on a wiring board.
Figure 4:
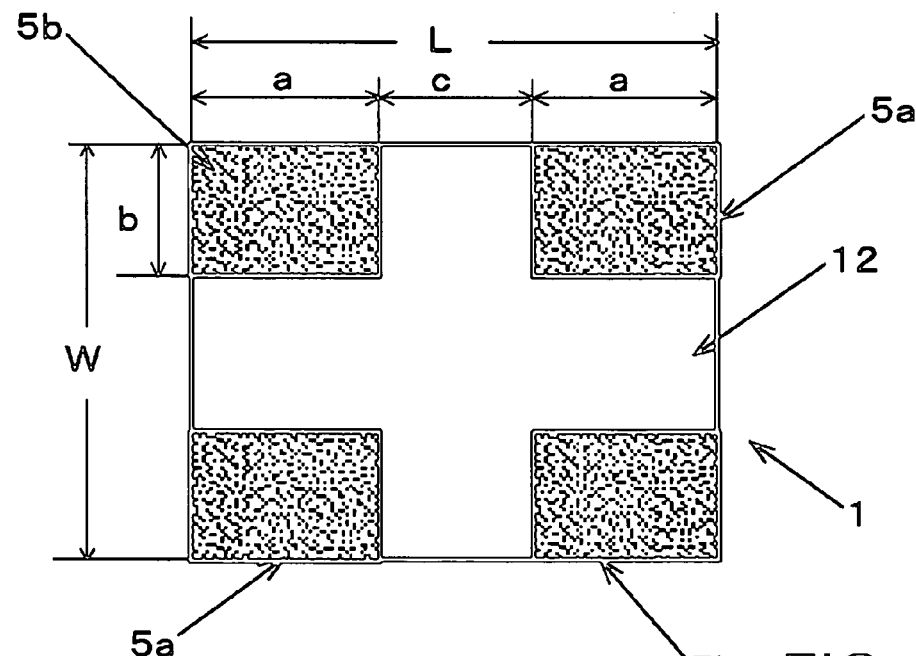
FIG. 4 is a view for explaining the size of the mounting electrodes and the dimensions of the bottom surface of a surface mount type crystal oscillator.

As with the crystal unit of the prior art shown in FIGS. 1A and 1B, the crystal unit shown in FIGS. 5A and 5B is a device in which crystal blank 2 is accommodated within container body 1 having a flat and substantially rectangular parallelepiped outer shape that appears rectangular when mounted on a wiring board and viewed from above. Crystal blank 2 is held within a cavity provided in container body 1, and hermetically sealed inside the cavity by covering container body 1 with metal cover 3 to close the cavity. Mounting electrodes 5a and 5b are provided at the four corners of the outside bottom surface of container body 1.

Receptacle 1 has planar dimensions in which, for example, length L is 2.0 mm and width W is 1.6 mm. Mounting electrodes 5a and 5b are both formed as conductive layers having a substantially rectangular planar shape on the outside bottom surface of receptacle 1, the length "a" of each mounting electrode being 0.7 mm in the direction of length L of container body 1 and the length "b" being 0.5 mm in the direction of width W of container body 1. The spacing "c" between mounting electrodes along each side of the outside bottom surface of container body 1 is 0.6 mm, and this spacing "c" is shorter than the length "a" (=0.7 mm) of the longitudinal length of the mounting electrodes.

In this surface mount type crystal unit, jetty 12 is provided as mutually intersecting linear promontories or ridges that extend in both the horizontal and vertical directions in FIG. 5B in the cross-shaped area that is interposed between four mounting electrodes 5a, 5b of the outside bottom surface of container body 1. In other words, jetty 12 is provided in a cross shape on the outside bottom surface of container body 1 such that mounting electrodes 5a, 5b are separated.

Container body 1, which is composed of laminated ceramics, is formed by laminating and burning a plurality of ceramic green sheets, and jetty 12 is formed as a single unit with container body 1 by, before burning, applying a ceramic paste to the ceramic green sheet that corresponds to the outside bottom surface of container body 1 by means of a printing method and then burning. At this time, conductive layers that are to be the underlying electrodes of the mounting electrodes are also formed on the ceramic green sheet, and the underlying electrodes are also burned as a unit with container body 1. The underlying electrodes of mounting electrodes 5a, 5b are formed from tungsten (W) or molybdenum (Mo) film. After burning, mounting electrodes 5a, 5b are completed by plating nickel (Ni) and gold (Au) to stack on the underlying electrodes.

The thickness of mounting electrodes 5a, 5b that have been formed in this way is approximately 15 μm. In contrast, the height of jetty 12 is 20 to 30 μm, which is greater than the thickness of mounting electrodes 5a, 5b.

Figure 6:
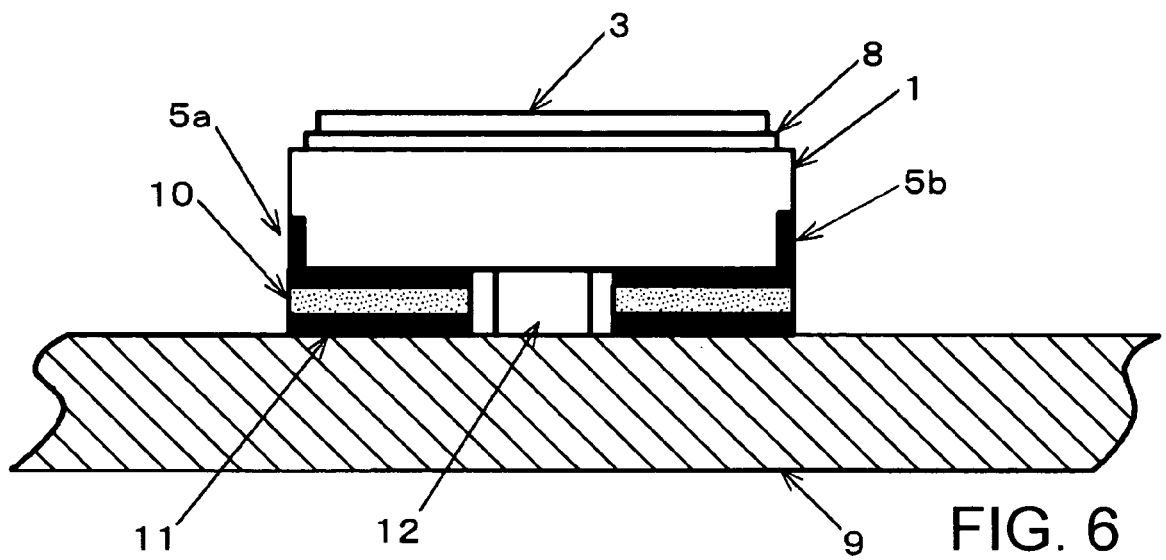
FIG. 6 is a sectional view showing the surface mount type crystal unit when mounted on a wiring board.

As with the above-described crystal unit of the prior art, a crystal unit in which jetty 12 has been provided in this way is also mounted on a wiring board by means of a technique such as reflow soldering. FIG. 6 shows the crystal unit of the present embodiment mounted on wiring board 9 by reflow soldering. According to the present embodiment, if flux should flow out from the peripheries of circuit terminals 11 and mounting electrodes 5 when cream solder 10 is melted, jetty 12 checks the flow. Accordingly, the flow of the solder itself that accompanies the flow of flux is prevented, and electrical short circuits between circuit terminals 11 or between mounting electrodes 5 can be prevented. In particular, the height of cross-shaped jetty 12 is made greater than the thickness of mounting electrodes 5 in the present embodiment, and jetty 12 therefore approaches or makes contact with the surface of the wiring board when the crystal unit is placed onto wiring board 9. Jetty 12 therefore provides a barrier not only between the mounting electrodes, but also between circuit terminals 11 as well, and the flow of flux and the melted solder that accompanies the flux can therefore be reliably checked. If for example the height of jetty 12 were approximately equal to the thickness of mounting electrodes 5a, 5b, a gap that is equivalent to the thickness of cream solder 10 would exist between circuit terminals 11, and flux and melted solder would therefore tend to flow between circuit terminals 11. Even if the height of jetty 12 were inadequate and electrical bonding between circuit terminals 11 could not be prevented, the provision of jetty 12 can at least prevent electrical short circuits between mounting electrodes 5. However, electrical short circuits between circuit terminals 11 can be more reliably prevented by providing, for example, trenches in the cross-shaped area between the circuit terminals on the surface of wiring board 9.

Figure 7:
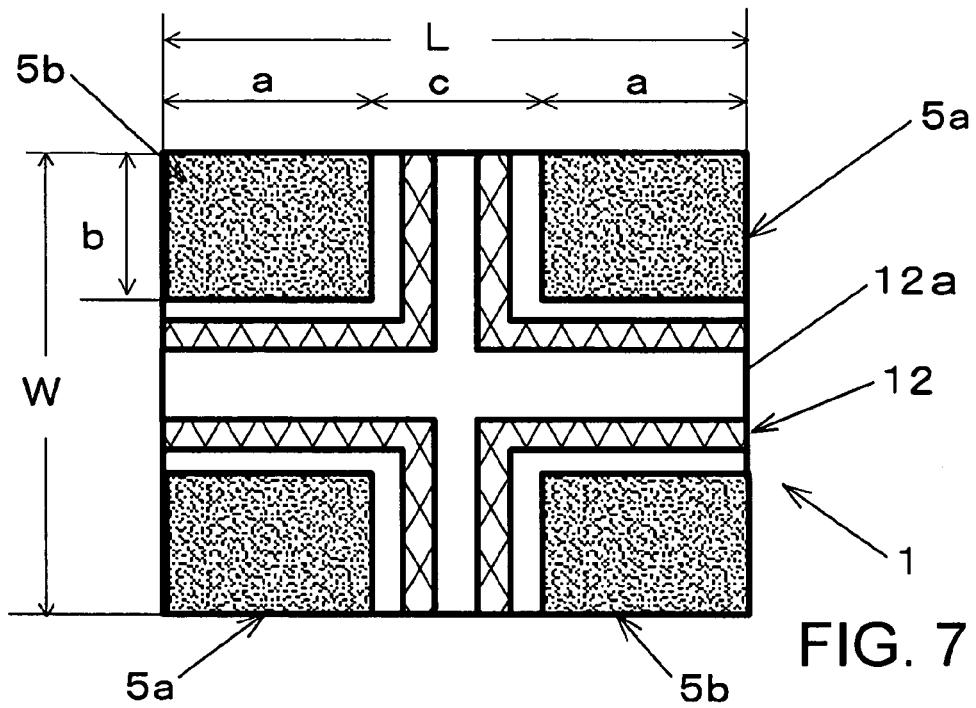
FIG. 7 is a bottom plan view showing a surface mount type crystal unit according to another embodiment of the present invention.

Although jetty 12 has a convex profile in the foregoing explanation, grooves 12a may also be provided in jetty 12 as shown in FIG. 7. In other words, in the configuration shown in FIG. 7, a jetty having an "L" planar shape for each mounting electrode is substantially provided along the outer periphery of the mounting electrode.

Although the case of a crystal unit is taken as an example in the foregoing explanation regarding a surface mount type crystal device of the present invention, the present invention can also be applied to crystal devices other than a crystal unit. For example, the present invention can be applied to a surface mount type crystal oscillator that incorporates an oscillation circuit other than a crystal blank.

Figure 8:
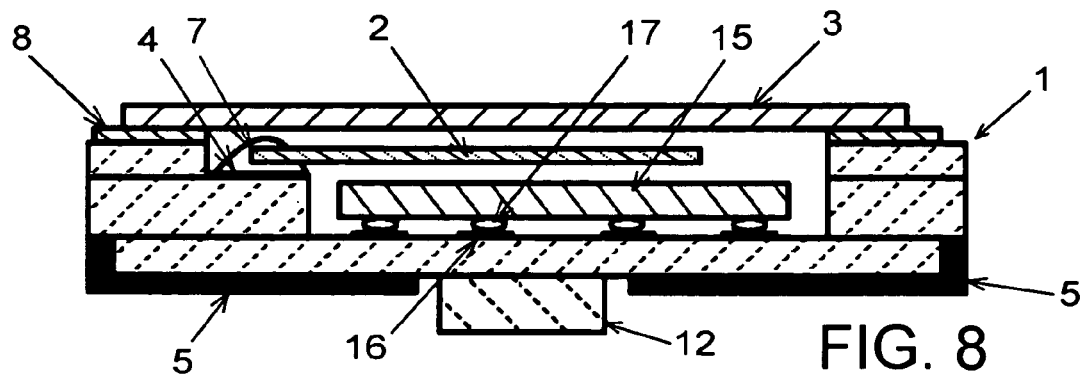
FIG. 8 is a sectional view showing the configuration of a surface mount type crystal oscillator according to a further embodiment of the present invention.

FIG. 8 illustrates an example of such a surface mount type crystal oscillator. In the crystal oscillator shown in FIG. 8, a stepped portion is formed in the inner side surface of the cavity of container body 1, and a pair of crystal holding terminals 4 are arranged on the upper surface of the stepped portion. Crystal blank 2 is secured to crystal holding terminals 4 by means of, for example, a conductive adhesive 7, and held within the cavity. IC chip 15 is a component in which electronic circuits including the oscillation circuit that uses crystal blank 2 are integrated on a semiconductor substrate. A plurality of circuit terminals are formed on the inner bottom surface of the cavity of container body 1. IC chip 15 is electrically and mechanically connected to circuit terminals 16 by means of ultrasonic thermo-compression bonding using bumps 17, and secured to the bottom surface of the cavity. The cavity is closed by metal cover 3. As a result, crystal blank 2 and IC chip 15 are hermetically sealed in the cavity.

Mounting electrodes 5 used when surface mounting this crystal oscillator on a wiring board are provided in the four corners of the outside bottom surface of container body 1. These mounting electrodes 5 include, for example, a power supply terminal, a grounding terminal, and an output terminal for oscillation output. Mounting electrodes 5 are electrically connected to circuit terminals 16 by way of conductive paths (not shown), and crystal holding terminals 4 are also electrically connected to circuit terminals 16 by way of the conductive paths formed on the inner wall of the cavity. Mounting terminals 5 are therefore electrically connected to IC chip 15 and crystal blank 2 is electrically connected to the oscillation circuit within IC chip 15 by way of crystal holding terminals 4, the conductive paths, and circuit terminals 16. In this crystal oscillator, the spacing between mounting electrodes 5 on at least one side of the outside bottom surface of container body 1 is smaller than a length of mounting electrodes 5 in a direction along the side of the outside bottom surface.

As with the case of the crystal unit shown in FIGS. 5A and 5B, in this surface mount type crystal oscillator, jetty 12 is provided in the cross-shaped area that is interposed between four mounting electrodes 5 of the outside bottom surface of container body 1.

Since jetty 12 is provided in the crystal oscillator shown in FIG. 8, electrical short circuits can be prevented between the mounting electrodes of the crystal oscillator and between adjacent circuit terminals on a wiring board on which the crystal oscillator is mounted.

What is claimed is:

1. A crystal device for surface mounting provided with at least: a container body having a substantially rectangular outer shape and mounting electrodes formed at four corners of a outside bottom surface of the container body; and a crystal blank hermetically sealed within said container body; wherein:

spacing between mounting electrodes on at least one side of said outside bottom surface is smaller than a length of said mounting electrodes in a direction along said side; and a jetty having a height greater than a thickness of said mounting electrodes is provided in a cross-shaped area interposed between said mounting electrodes on said outside bottom surface.

2. The crystal device according to claim 1, wherein said container body is composed of laminated ceramics.

3. The crystal device according to claim 2, wherein said jetty is formed as a single unit with said container body by applying ceramic paste to a ceramic green sheet that corresponds to said outside bottom surface and then burning.

4. The crystal device according to claim 1, wherein a planar shape of said container body has a length no greater than 2.0 mm on a long sides thereof and no greater than 1.6 mm on short sides thereof.

5. The crystal device according to claim 1, wherein said crystal device is configured as a crystal unit.

6. The crystal device according to claim 1, wherein said crystal device is configured as a crystal oscillator.

7. The crystal device according to claim 6, wherein an IC chip in which an oscillation circuit that uses said crystal blank is integrated is provided within said container body.

* * * * *